United States Patent [19]

Eberl et al.

[11] 3,961,105

[45] June 1, 1976

[54] METHOD FOR THE MANUFACTURE OF COATED CALCIUM SULFATE WHISKER FIBERS

[75] Inventors: James Joseph Eberl, Moylan; Edmund Thelen, Strafford; Harold L. Heller, Narberth, all of Pa.

[73] Assignee: Certain-teed Products Corporation, Valley Forge, Pa.

[22] Filed: July 1, 1974

[21] Appl. No.: 484,695

Related U.S. Application Data

[63] Continuation-in-part of Ser. No. 238,048, March 27, 1972, Pat. No. 3,822,340.

[52] U.S. Cl.................................. 427/220; 428/375; 427/221; 427/227; 156/623; 106/109
[51] Int. Cl.$^2$......................... B05D 3/02; D02G 3/00
[58] Field of Search.............. 117/54, 123 C, 123 E, 117/123 D; 106/109; 423/555; 427/314, 220, 221, 227; 428/375; 156/623

[56] References Cited
UNITED STATES PATENTS

| 1,442,406 | 1/1923 | Hennicke............................ 423/555 |
| 2,151,331 | 3/1939 | Roberts.............................. 423/555 |
| 3,410,655 | 11/1968 | Ruter et al.......................... 423/170 |

*Primary Examiner*—Harry J. Gwinnell
*Assistant Examiner*—Sadie L. Childs
*Attorney, Agent, or Firm*—Edward J. Sites

[57] ABSTRACT

A method is provided for the manufacture of coated calcium sulfate whisker fibers wherein the calcium sulfate whisker fibers are formed in an aqueous solution at about 110°–150°C, dryed, and preferably fired. Thereafter the resulting fibers are treated to form a protective coating on the fibers.

9 Claims, No Drawings

METHOD FOR THE MANUFACTURE OF COATED CALCIUM SULFATE WHISKER FIBERS

CROSS REFERENCE TO RELATED APPLICATIONS

This application is a continuation-in-part of co-pending patent application, Ser. No. 238,048 filed Mar. 27, 1972, now U.S. Pat. No. 3,822,340.

BRIEF SUMMARY OF THE INVENTION

This invention relates to calcium sulfate whisker fibers and more particularly concerns a stabilized calcium sulfate whisker fiber.

DETAILED DESCRIPTION

One of the forms of calcium sulfate, such as calcium sulfate hemihydrate, is of an acicular shape. Other forms of calcium sulfate such as soluble calcium sulfate anhydrite have a fibrous shape as described in the co-pending patent application disclosed above. Since these materials may revert to nonfibrous forms in the presence of moisture, they may be limited in their commercial use, especially where moisture is present. In addition, storage of the insoluble forms under sufficiently dry conditions to prevent damage or deterioration may be costly.

Stabilized calcium sulfate whisker fibers are provided. The whisker fibers are selected from the group consisting of stabilized calcium sulfate hemihydrate whisker fiber, stabilized soluble calcium sulfate anhydrite whisker fiber and stabilized insoluble calcium sulfate anhydrite whisker fiber. The stabilized calcium sulfate whisker fiber is a single crystal having a diameter to length ratio of at least 1 to 6. Stabilized forms of calcium sulfate fibers may be used as a low-cost reinforcing material even where moisture is present without a loss of the fibrous reinforcement shape. The stabilized calcium sulfate whisker fiber also can be stored for extended periods of time prior to use without deterioration.

In the preferred embodiment, the whisker fibers are comprised of stabilized calcium sulfate hemihydrate whisker fiber, stabilized soluble calcium sulfate anhydrite whisker fiber, and stabilized insoluble calcium sulfate anhydrite whisker fiber. Although the insoluble calcium sulfate anhydrite whisker fibers need not generally be stabilized, it is preferred that they are also stabilized for certain applications where they will be exposed to a considerable amount of moisture to further insure that the whisker fiber shape is maintained.

Whisker fibers are single crystals each of which has a diameter of from about 0.5 micron up to about 5 microns and a length-to-diameter ratio of about 6 to 1 to in excess of 100 to 1. The calculated modulus of elasticity of the whisker fiber is about $26 \times 10^6$ psi and their tensile strength is about 300,000 psi. They also have an index of refraction of about 1.585 and a density of about 3.0 g/cm$^2$. The whisker fibers in the pure state are white in color and they have a smooth silky feel.

MANUFACTURE OF THE WHISKER FIBERS

The fibers of this invention are most preferably prepared by initially forming calcium sulfate hemihydrate whisker fibers. The calcium sulfate hemihydrate whisker fibers are then fired to an intermediate temperature to convert the calcium sulfate hemihydrate fibers into soluble calcium sulfate anhydrite whisker fibers and further fired to a higher temperature to convert the insoluble calcium sulfate anhydrite whisker fibers into the insoluble calcium sulfate anhydrite whisker fibers.

In the preferred method of manufacture of calcium sulfate hemihydrate whisker fiber, a gypsum powder is initially slurried with water. The preferred slurry concentration is in the range of 2 to 30 grams of calcium sulfate dihydrate per liter of water.

The slurry is then charged into a high pressure steam autoclave reactor, the reactor is then sealed, and the slurry is heated to a temperature of about 105°C to 150°C using the water as the reaction media. Typically excellent calcium sulfate hemihydrate whisker fibers are obtained in three or five minutes at 125°C. The calcium sulfate hemihydrate whisker fibers are then removed from the reactor.

The calcium sulfate hemihydrate fibers are then recovered from the aqueous reaction mixture without cooling and are dried at about 100°C (without cooling below 100°C) to remove any surface water. The calcium sulfate hemihydrate whisker fibers must be continuously maintained at a temperature of about 100°C to prevent the rehydration to calcium sulfate dihydrate. This is necessary since in the presence of water at a temperature slightly below 100°C, the rate of rehydration to calcium sulfate hemihydrate is quite rapid.

The soluble calcium sulfate anhydrite whisker fibers are formed by firing the calcium sulfate hemihydrates whisker fiber at a temperature less than about 140°C.

The insoluble calcium sulfate anhydrite fibers are produced by firing the calcium sulfate hemihydrate whisker fibers or the soluble calcium sulfate anhydrite whisker fibers. The conversion to the insoluble calcium sulfate hemihydrate whisker fiber begins at a firing temperature in excess of about 140°C and proceeds more rapidly and completely at a temperature of 200°C or higher.

STABILIZATION OF THE WHISKER FIBERS

Stabilization of the calcium sulfate hemihydrate and soluble calcium sulfate anhydrite whisker fibers is required in order to prevent the transformation from the fibrous shape. Stabilization of the insoluble calcium sulfate anhydrite whisker fibers although not necessary is desirable as an added precaution where the whisker fibers will be exposed to a considerable amount of moisture to further insure that they will not lose their fibrous shape.

The whisker fibers can be stabilized by any means which prevents rehydration and does not damage the whisker fibers. Certain relatively inert water proofing materials such as paraffin wax can be used. Although stabilization with these materials is suitable, it is not the preferred method since these materials depend on physical adhesion and accordingly there may be a tendency for the material to strip from the whisker fibers under certain conditions as well as to cause the individual fibers to stick together in bunches.

Since calcium sulfate whisker fibers exhibit a strongly cationic and anionic adhesion capability (probably due to the sulfate and calcium ions) the preferred stabilization method is to react the fibers with hydrolyzed proteins to produce a monomolecular highly adherent protective coating thereon. Typical results obtained using protein hydrolyzates as reactants are as follows:

| Weight % of protein hydrolyzates based on weight of hemihydrate whisker fiber | Time required to reconvert hemihydrate to dihydrate in water solution at 20°C |
|---|---|
| 0.00% | 6 minutes |
| 0.005% | 2 hours |
| 0.05% | 48 hours |
| 0.50% | 2 months plus |

The anhydrite forms of the whisker fibers and in particular the insoluble anhydrite whisker fibers are substantially stable. Without stabilizers the insoluble anhydrite whisker fiber showed no change in form in one week while in contact with water. After stabilization with 0.05% protein hydrolyzate no change in form was observed after one month.

In addition, anionic polycarboxylic acid polymers may be used as stabilizers to prevent the rehydration of the anhydrite form and particularly the hemihydrate form to the dihydrate form. Suitable anionic polycarboxylic acid polymers are:
polyethylene maleic acid
polyacrylic acid
polymethyl vinyl ether maleic acid
poly chloracrylic
polystyrene-fumaric acid
polyvinyl acetate-crotonic acid
polyvinyl methyl ether-fumaric acid These acids are reacted with a base such as ammonia, sodium, potassium, or lithium hydroxide or an alkaline earth hydroxide to form a relatively soluble polymeric carboxylic acid salt. The soluble salt reaction product is reacted with the whisker fiber to stabilize the whisker fiber shape.

The following table gives the time of stabilization of typical polycarboxylic acid polymers:

| Stabilizer (sodium salt thereof) | Concentration of Stabilizer on weight of hemihydrate whisker fiber | Time to reconvert Hemihydrate to Dihydrate when Immersed in Water at 20°C |
|---|---|---|
| None | 0.00% | 6 minutes |
| Polyethylene-maleic acid copolymer | 0.08% | 90 minutes |
| Polyethylene-maleic acid copolymer | 0.16% | 6 hours |
| Polyethylene-maleic acid copolymer | 0.20% | 48 hours |
| Polyethylene-maleic acid copolymer | 0.40% | 7 days plus |
| Polyacrylic acid | 0.16% | 8 hours |
| Polystyrene-maleic acid | 0.40% | 45 minutes |

The following examples are given by way of further illustration of the present invention and are not intended to limit the scope of the claims beyond that of the subjoined claims. All parts and percentages are parts and percentages by weight, not volume, unless otherwise noted.

EXAMPLE 1

A five liter aqueous mixture was prepared which contains 100 grams of calcium sulfate dihydrate. This mixture was charged into a pressure reactor equipped with a sight glass and a vertical stirrer. The mixture was agitated by the stirrer at about 100 RPM. The reactor was sealed and heated to a temperature in the range of 110°C to 150°C. The preferred temperature is 125°C. The mixture is maintained at this temperature for 5 minutes. The reaction mixture was observed through the sight glass. The initial mixture was a milky-like dispersion. As the temperature approached 125°C the dispersion markedly changed in appearance as two separate phases formed. Formation of the fibers was quite noticeable. After about 3 minutes the formation was substantialy complete. After five minutes no further formation of fibers was observed. A drain pipe in the bottom of the reactor was opened and the aqueous mixture of the whisker fibers was evacuated from the reactor by the pressure within the reactor. The discharged product was filtered to separate the whisker fibers from the water. A sample of the whisker fibers was recovered and later analyzed and it was found to be calcium sulfate hemihydrate. The remainder of the recovered product was dried and thereafter stabilized with 0.40% polyethylene-maleic acid copolymer based on the weight of the whisker fibers. The product thus obtained was stabilized calcium sulfate hemihydrate whisker fibers. The yield of the desired product was in excess of 90% of the theoretical yield. In subsequent runs when the reactor liquid slurry was recycled, the yield approached 100%.

EXAMPLE 2

Example 1 was repeated except that after the whisker fibers were removed from the reactor they were fired at 125°C in an oven until the calcium sulfate hemihydrate whisker fiber was converted to the soluble calcium sulfate anhydrite whisker fibers. This whisker fiber thereafter was stabilized as previously disclosed.

EXAMPLE 3

Example 1 was repeated except that the product from the reactor was fired at a temperature of 200°C or higher and maintained at this temperature until insoluble calcium sulfate anhydrite whisker fibers were obtained. This whisker fiber was then stabilized as previously disclosed.

We claim:
1. The method of manufacturing the coated calcium sulfate hemihydrate whisker fiber having a diameter-to-length ratio of at least about 1 to 6 comprising the steps of:
  a. heating an aqueous solution of calcium sulfate dihydrate to a temperature of about 110°C to 150°C until calcium sulfate hemihydrate whisker fibers are formed;
  b. recovering said calcium sulfate hemihydrate whisker fibers from said aqueous solution; and
  c. applying an inert waterproofing material to said dried calcium sulfate hemihydrate whisker fibers to form a protective coating thereon.

2. The method of manufacturing the coated calcium sulfate hemihydrate whisker fiber having a diameter-to-length ratio of at least about 1 to 6 comprising the steps of:
  a. heating an aqueous solution of calcium sulfate dihydrate to a temperature of about 110°C to 150°C until calcium sulfate hemihydrate whisker fibers are formed;
  b. recovering said calcium sulfate hemihydrate whisker fibers from said aqueous solution; and
  c. reacting said dried calcium sulfate hemihydrate whisker fibers with hydrolyzed proteins to form a protective coating thereon.

3. The method of manufacturing the coated calcium sulfate hemihydrate whisker fiber having a diameter-to-length ratio of at least about 1 to 6 comprising the steps of:
   a. heating an aqueous solution of calcium sulfate dihydrate to a temperature of about 110°C to 150°C until calcium sulfate hemihydrate whisker fibers are formed;
   b. recovering said calcium sulfate hemihydrate whisker fibers from said aqueous solution; and
   c. reacting a relatively soluble polymeric carboxylic acid salt with said dried calcium sulfate hemihydrate whisker fibers to form a protective coating thereon.

4. The method of manufacturing the coated soluble calcium sulfate anhydrite whisker fiber comprising the steps of:
   a. heating an aqueous solution of calcium sulfate dihydrate to a temperature of about 110°C to 150°C until calcium sulfate hemihydrate whisker fibers form;
   b. recovering said calcium sulfate hemihydrate whisker fiber from said aqueous mixture;
   c. firing said calcium sulfate hemihydrate whisker fibers until said calcium sulfate hemihydrate whisker fibers are converted into soluble calcium sulfate anhydrite whisker fibers; and
   d. then applying an inert waterproofing material to said soluble calcium sulfate anhydrite whisker fibers to form a protective coating thereon.

5. The method of manufacturing the coated soluble calcium sulfate anhydrite whisker fiber comprising the steps of:
   a. heating an aqueous solution of calcium sulfate dihydrate to a temperature of about 110°C to 150°C until calcium sulfate hemihydrate whisker fibers form;
   b. recovering said calcium sulfate hemihydrate whisker fiber from said aqueous mixture;
   c. firing said calcium sulfate hemihydrate whisker fibers until said calcium sulfate hemihydrate whisker fibers are converted into soluble calcium sulfate anhydrite whisker fibers; and
   d. then reacting said soluble calcium sulfate anhydrite whisker fibers with hydrolyzed proteins to form a protective coating thereon.

6. The method of manufacturing the coated soluble calcium sulfate anhydrite whisker fiber comprising the steps of:
   a. heating an aqueous solution of calcium sulfate dihydrate to a temperature of about 110°C to 150°C until calcium sulfate hemihydrate whisker fibers form;
   b. recovering said calcium sulfate hemihydrate whisker fiber from said aqueous mixture;
   c. firing said calcium sulfate hemihydrate whisker fibers until said calcium sulfate hemihydrate whisker fibers are converted into soluble calcium sulfate anhydrite whisker fibers; and
   d. then reacting a relatively soluble polymeric carboxylic acid salt with said soluble calcium sulfate anhydrite whisker fibers to form a protective coating thereon.

7. The method of manufacturing the coated insoluble calcium sulfate anhydrite whisker fiber according to claim 1 comprising the steps of:
   a. heating an aqueous solution of calcium sulfate dihydrite to a temperature of about 110°C to 150°C until calcium sulfate hemihydrate whisker fibers are obtained;
   b. recovering said calcium sulfate hemihydrate whisker fibers from said aqueous mixture;
   c. firing said calcium sulfate hemihydrate whisker fibers at about at least 150°C or higher until insoluble calcium sulfate anhydrite whisker fibers are obtained; and
   d. then applying an inert waterproofing material to said insoluble calcium anhydrite whisker fibers to form a protective coating thereon.

8. The method of manufacturing the coated insoluble calcium sulfate anhydrite whisker fiber according to claim 1 comprising the steps of:
   a. heating an aqueous solution of calcium sulfate dihydrate to a temperature of about 110°C to 150°C until calcium sulfate hemihydrate whisker fibers are obtained;
   b. recovering said calcium sulfate hemihydrate whisker fibers from said aqueous mixture;
   c. firing said calcium sulfate hemihydrate whisker fibers at about at least 150°C or higher until insoluble calcium sulfate anhydrite whisker fibers are obtained; and
   d. then reacting said insoluble calcium anhydrite whisker fibers with hydrolyzed proteins to form a protective coating thereon.

9. The method of manufacturing the coated insoluble calcium sulfate anhydrite whisker fiber according to claim 1 comprising the steps of:
   a. heating an aqueous solution of calcium sulfate dihydrite to a temperature of about 110°C to 150°C until calcium sulfate hemihydrate whisker fibers are obtained;
   b. recovering said calcium sulfate hemihydrate whisker fibers from said aqueous mixture;
   c. firing said calcium sulfate hemihydrate whisker fibers at about at least 150°C or higher until insoluble calcium sulfate anhydrite whisker fibers are obtained; and
   d. then reacting a relatively soluble polymeric carboxylic acid salt with said insoluble anhydrite whisker fibers to form a protective coating thereon.

* * * * *